(12) United States Patent
Huemoeller et al.

(10) Patent No.: US 8,390,116 B1
(45) Date of Patent: Mar. 5, 2013

(54) FLIP CHIP BUMP STRUCTURE AND FABRICATION METHOD

(75) Inventors: Ronald Patrick Huemoeller, Chandler, AZ (US); Roger D. St. Amand, Tempe, AZ (US); Robert Francis Darveaux, Higley, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 3 days.

(21) Appl. No.: 13/065,298

(22) Filed: Mar. 18, 2011

Related U.S. Application Data

(62) Division of application No. 12/144,145, filed on Jun. 23, 2008, now Pat. No. 7,932,170.

(51) Int. Cl.
*H01L 23/48* (2006.01)

(52) U.S. Cl. ............ 257/737; 257/778; 257/E23.021; 257/E23.07

(58) Field of Classification Search .......... 257/737, 257/778, E23.021, E23.07, E23.073
See application file for complete search history.

(56) References Cited

U.S. PATENT DOCUMENTS

| | | | |
|---|---|---|---|
| 5,909,009 A * | 6/1999 | Tanaka | 174/255 |
| 6,194,250 B1 | 2/2001 | Melton et al. | |
| 6,212,769 B1 | 4/2001 | Boyko et al. | |
| 6,590,165 B1 * | 7/2003 | Takada et al. | 174/266 |
| 6,707,145 B2 | 3/2004 | Pollock et al. | |
| 6,730,857 B2 | 5/2004 | Konrad et al. | |
| 6,740,964 B2 | 5/2004 | Sasaki | |
| 6,775,907 B1 | 8/2004 | Boyko et al. | |
| 6,919,514 B2 | 7/2005 | Konrad et al. | |
| 6,969,674 B2 | 11/2005 | Chang et al. | |
| 6,969,907 B2 | 11/2005 | Imai et al. | |
| 7,242,081 B1 | 7/2007 | Lee | |
| 7,345,361 B2 | 3/2008 | Mallik et al. | |
| 7,372,151 B1 | 5/2008 | Fan et al. | |
| 2002/0100164 A1 * | 8/2002 | Tanaka et al. | 29/832 |
| 2003/0013291 A1 | 1/2003 | Chen et al. | |
| 2003/0232486 A1 | 12/2003 | Mashino | |
| 2004/0106232 A1 | 6/2004 | Sakuyama et al. | |
| 2004/0232562 A1 | 11/2004 | Hortaleza et al. | |
| 2006/0291029 A1 | 12/2006 | Lin et al. | |
| 2007/0045826 A1 * | 3/2007 | Lee et al. | 257/723 |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Kuo, "Blind Via Capture Pad Structure and Fabrication Method", U.S. Appl. No. 11/615,467, filed Dec. 22, 2006.

Huemoeller et al., "Straight Conductor Blind Via Capture Pad Structure and Fabrication Method", U.S. Appl. No. 11/839,277, filed Aug. 15, 2007.

Berry et al., "Thin Stacked Interposer Package", U.S. Appl. No. 11/865,617, filed Oct. 1, 2007.

(Continued)

*Primary Examiner* — Peniel M Gumedzoe
(74) *Attorney, Agent, or Firm* — McKay and Hodgson, LLP; Serge J. Hodgson

(57) ABSTRACT

A method includes forming a patterned buildup layer on a first surface of a dielectric layer, the patterned buildup layer including a patterned buildup layer opening exposing a trace coupled to the dielectric layer. A conductor layer is flash plated on the patterned buildup layer and within the patterned buildup layer opening. The patterned buildup layer opening is filled with a blanket conductive filler layer. The blanket conductive filler layer and the conductor layer are planarized to form a flip chip bump.

18 Claims, 22 Drawing Sheets

OTHER PUBLICATIONS

Huemoeller et al., "Flip Chip Bump Structure and Fabrication Method", U.S. Appl. No. 12/144,145, filed Jun. 23, 2008.

* cited by examiner

FLIP CHIP BUMP STRUCTURE AND FABRICATION METHOD

RELATED APPLICATIONS

This application is a divisional of Huemoeller et al., U.S. patent application Ser. No. 12/144,145, filed on Jun. 23, 2008, entitled "FLIP CHIP BUMP STRUCTURE AND FABRICATION METHOD", now U.S. Pat. No. 7,932,170, issued on Apr. 26, 2011, which is herein incorporated by reference in its entirety.

BACKGROUND OF THE INVENTION

1. Field of the Invention

The present application relates to the field of electronics, and more particularly, to methods of forming flip chip bumps and related structures.

2. Description of the Related Art

A Solder On Pad (SOP) process is a technique of applying solder directly to an electrically conductive pad of a substrate to form a flip chip bump thereon. A SOP process encompasses both a solder mask defined (SMD) SOP process and a non solder mask defined (NSMD) SOP process.

In a SMD SOP process, openings are formed in a soldermask. Electrically conductive pads of the substrate are exposed through the soldermask openings. A solder screen process is used to apply solder paste within the soldermask openings. The solder paste is reflowed (heated to a melt and then cooled) to form flip chip bumps in the soldermask openings and electrically connected to the pads. However, if the size of the pads and thus solder mask openings becomes too small, i.e., the bump pitch becomes too small, the solder screen process cannot be reliably used to fill the soldermask openings. Unfortunately, this limits the use of a SMD SOP process for high density substrates.

In a NSMD SOP process, a solder screen process is used to selectively apply solder paste to electrically conductive pads of a substrate. The solder paste is reflowed to form flip chip bumps electrically connected to the pads. However, if the bump pitch becomes too small, the solder screen process cannot be reliably used due to shorting. Again, this limits the use of a NSMD SOP process for high density substrates.

SUMMARY OF THE INVENTION

A method includes forming a patterned buildup layer on a first surface of a dielectric layer, the patterned buildup layer including a patterned buildup layer opening exposing a trace coupled to the dielectric layer. A conductor layer is flash plated on the patterned buildup layer and within the patterned buildup layer opening. An upper resist is formed with a flip chip bump opening that exposes a portion of the conductor layer above the trace. The flip chip bump opening is filled to form a flip chip bump. The flip chip bump is defined by the patterned upper resist, which can be patterned to have the flip chip bump openings with extremely small pitch. Accordingly, the flip chip bump formation method is extremely well-suited for formation of high-density substrates.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
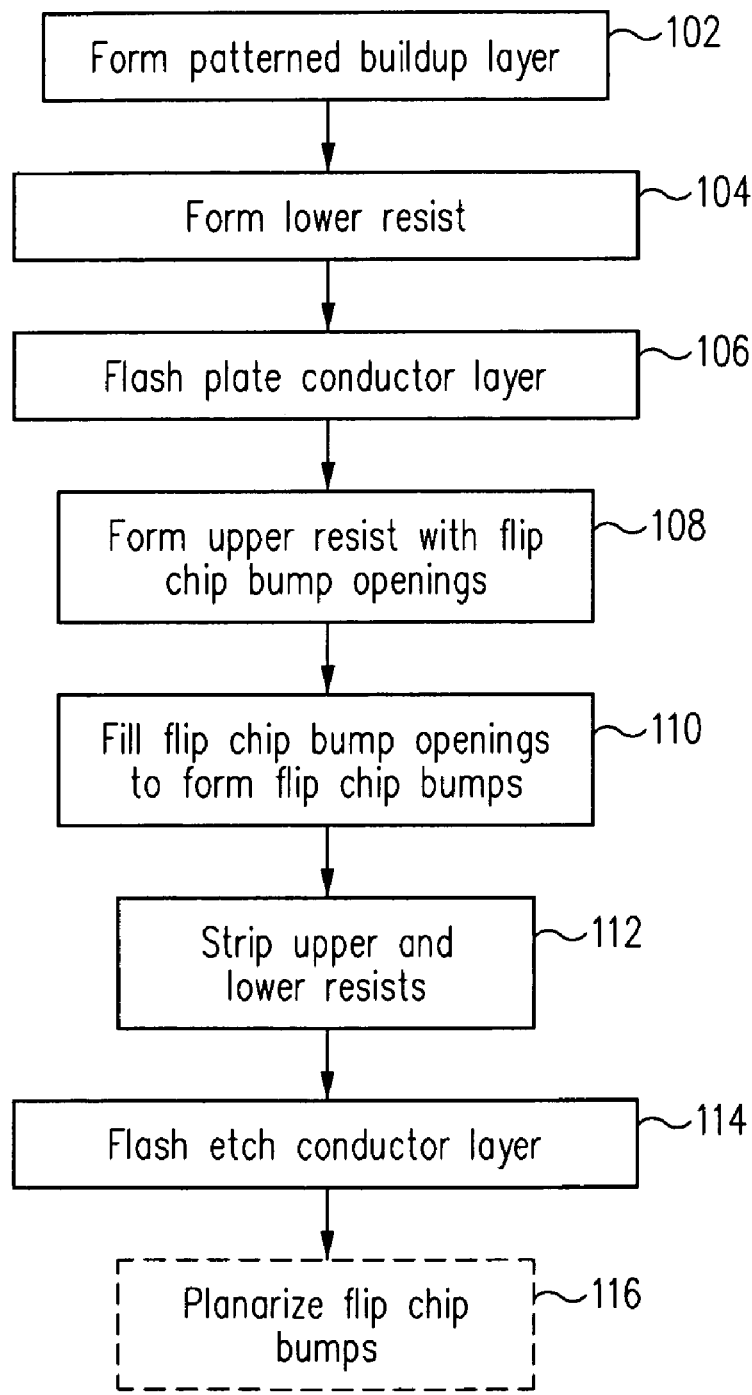
FIG. 1 is a flip chip bump formation method in accordance with one embodiment.
Figure 2:
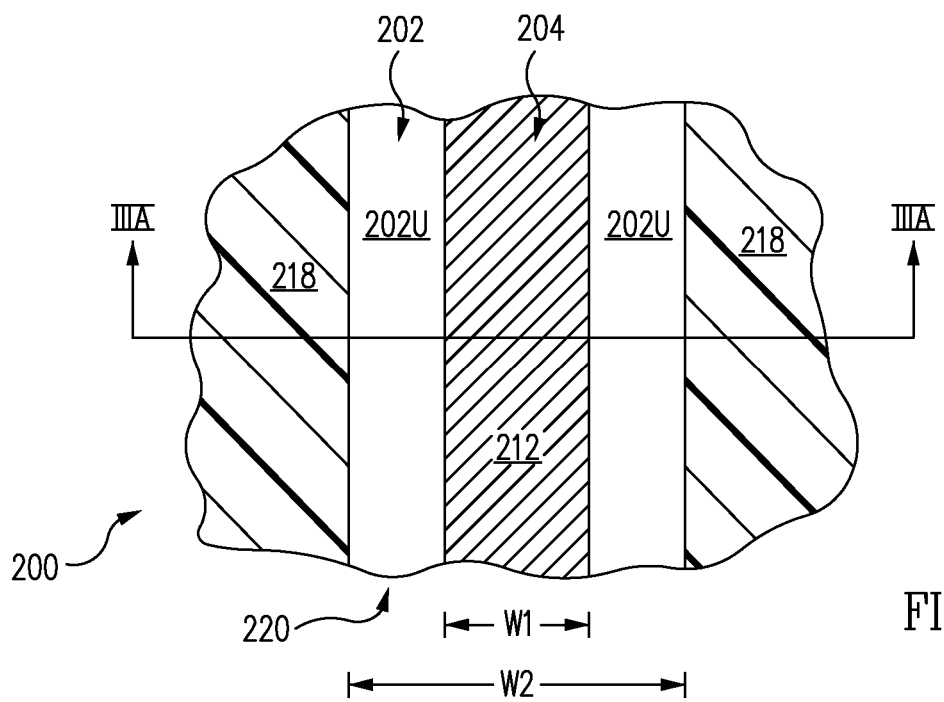
FIG. 2 is a top plan view of a flip chip bump structure during fabrication in accordance with one embodiment.
Figure 3A:
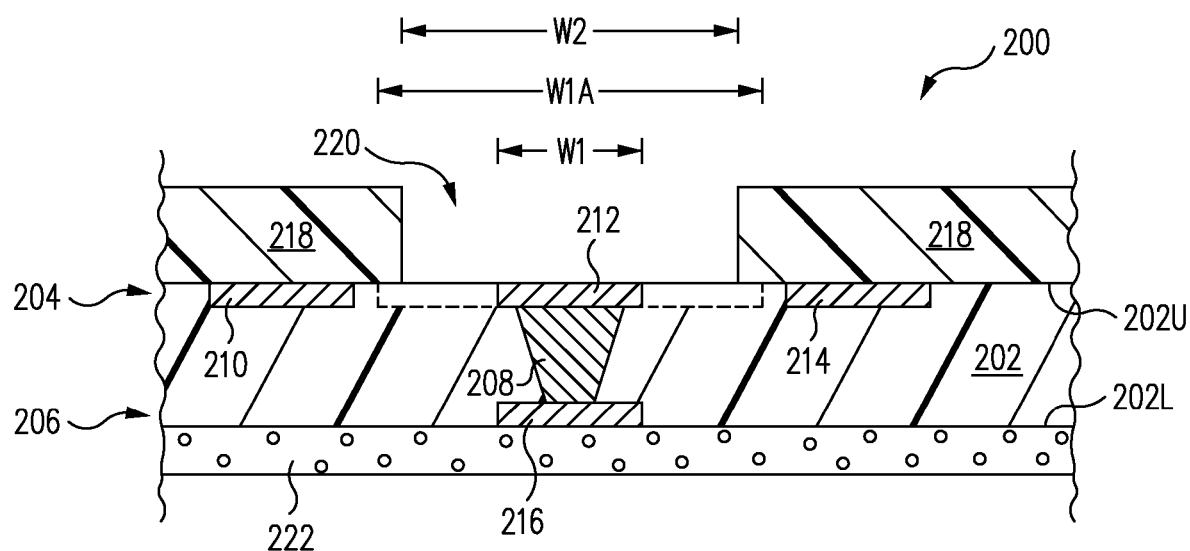
FIG. 3A is a cross-sectional view of the flip chip bump structure of FIG. 2 along the line IIIA-IIIA in accordance with one embodiment.

Referring to FIGS. 1, 2 and 3A together, a flip chip bump formation method 100 includes forming a patterned buildup layer 218 on a first surface 202U of a dielectric layer 202, patterned buildup layer 218 including a patterned buildup layer opening 220 exposing a trace 212 coupled to dielectric layer 202 in a form patterned buildup layer operation 102.

Figure 4:
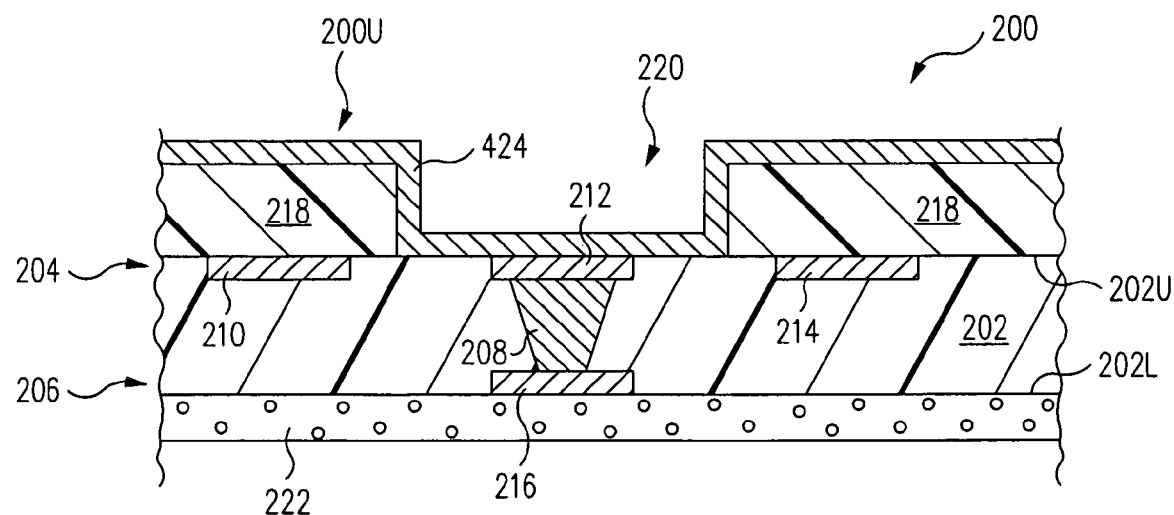
FIG. 4 is a cross-sectional view of the flip chip bump structure of FIG. 3A at a further stage during fabrication in accordance with one embodiment.

Referring now to FIGS. 1 and 4 together, a conductor layer 424 is flash plated on patterned buildup layer 218 and within patterned buildup layer opening 220 in a flash plate conductor layer operation 106.

Figure 5:
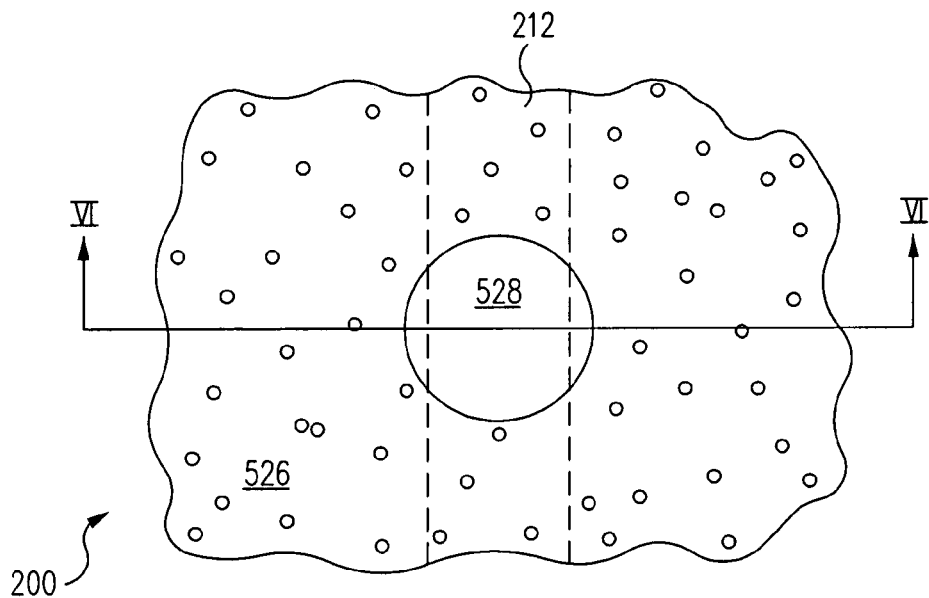
FIG. 5 is a top plan view of the flip chip bump structure of FIG. 4 at a further stage during fabrication in accordance with one embodiment.
Figure 6:
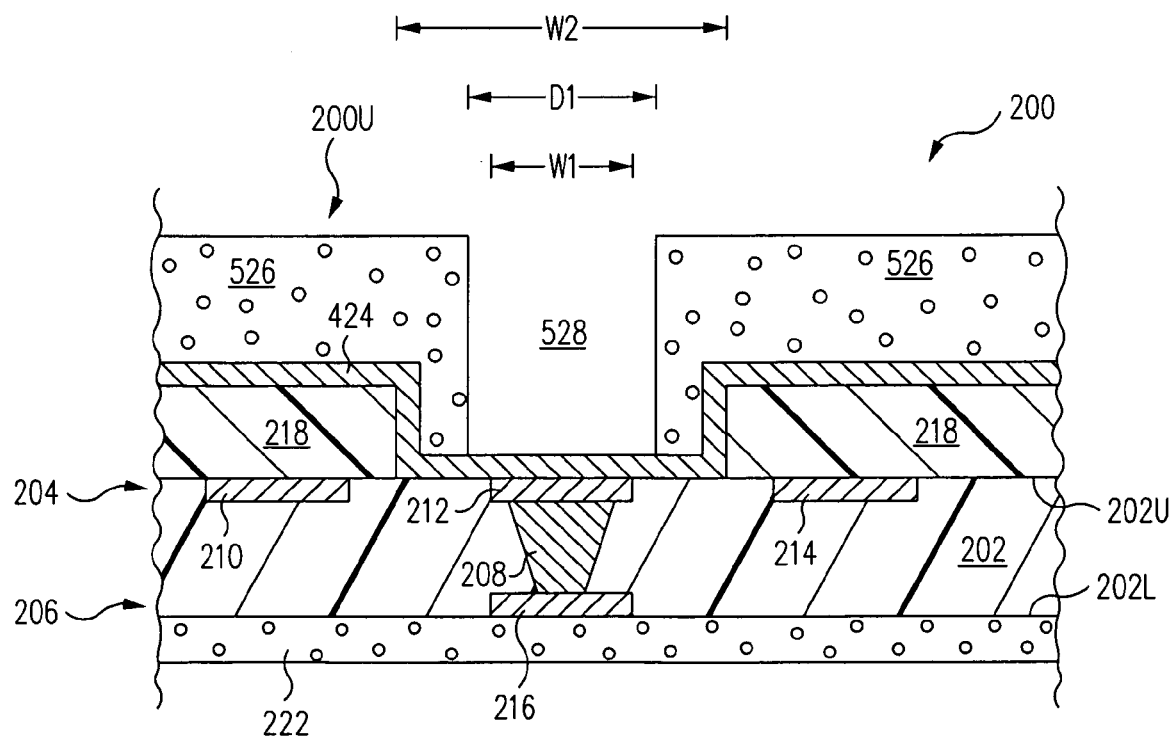
FIG. 6 is a cross-sectional view of the flip chip bump structure of FIG. 5 along the line VI-VI in accordance with one embodiment.

Referring now to FIGS. 1, 5, and 6 together, a patterned upper resist 526 is formed with a flip chip bump opening 528 that exposes a portion of conductor layer 424 above trace 212 in a form upper resist with flip chip bump openings operation 108.

Figure 7:
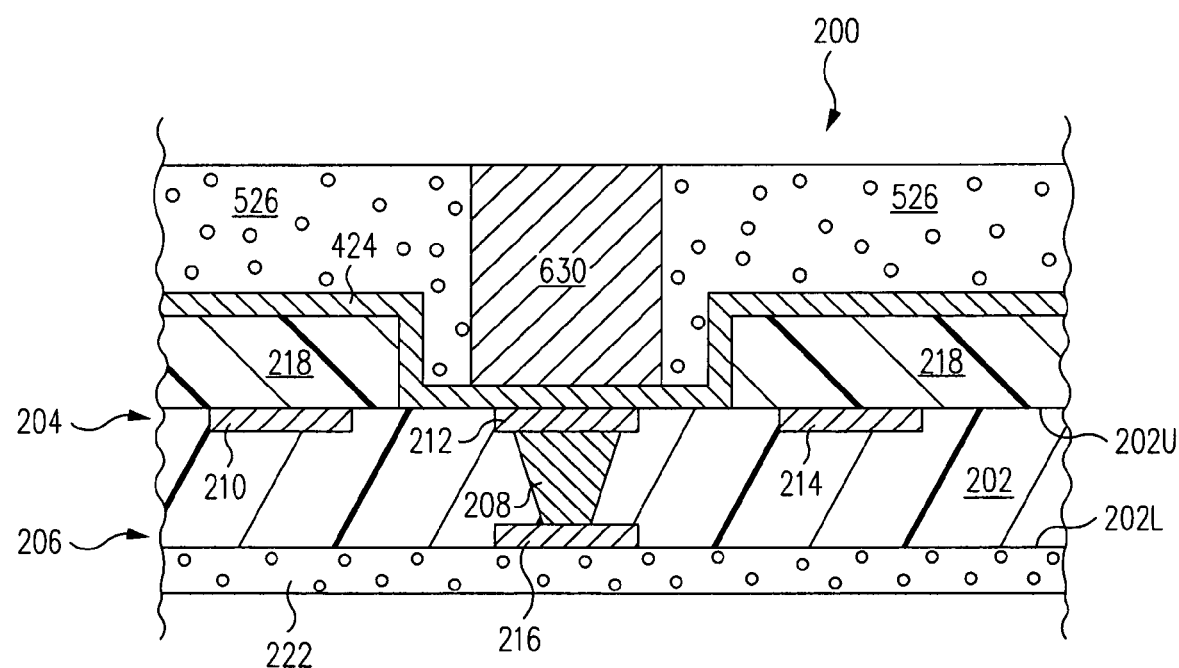
FIG. 7 is a cross-sectional view of the flip chip bump structure of FIG. 6 at a further stage during fabrication in accordance with one embodiment.

Referring now to FIGS. 1, 6 and 7 together, flip chip bump opening 528 is filled to form a flip chip bump 630 in a fill flip chip bump openings to form flip chip bumps operation 110. Flip chip bump 630 is defined by patterned upper resist 526, which can be patterned to have flip chip bump openings 528 with extremely small pitch. Accordingly, flip chip bump formation method 100 is extremely well-suited for formation of high-density substrates.

More particularly, FIG. 1 is a flip chip bump formation method 100 in accordance with one embodiment. FIG. 2 is a top plan view of a flip chip bump structure 200 during fabrication in accordance with one embodiment. FIG. 3A is a cross-sectional view of flip chip bump structure 200 of FIG. 2 along the line IIIA-IIIA in accordance with one embodiment.

Referring now to FIGS. 1, 2 and 3A together, flip chip bump structure 200 includes a dielectric layer 202, an upper circuit pattern 204, a lower circuit pattern 206, and electrically conductive vias 208. Dielectric layer 202 includes an upper, e.g., first, surface 202U and a lower, e.g., second, surface 202L.

Upper circuit pattern 204, sometimes called a first circuit pattern, is embedded within dielectric layer 202 at upper surface 202U. In one embodiment, upper circuit pattern 204 includes a plurality of traces, pads, other electrically conductive features and/or combinations thereof.

To illustrate, upper circuit pattern 204 includes upper traces 210, 212, 214, i.e., electrically conductive features extending lengthwise in a direction parallel to upper surface 202U of dielectric layer 202. In accordance with this embodiment, upper trace 212 forms the pad, sometimes called terminal, upon which the flip chip bump is to be formed as discussed below.

Similarly, lower circuit pattern 206, sometimes called a second circuit pattern, is embedded within dielectric layer 202 at lower surface 202L. In one embodiment, lower circuit pattern 206 includes a plurality of traces, pads, other electrically conductive features and/or combinations thereof.

To illustrate, lower circuit pattern 206 includes a lower land 216, e.g., a ball grid array terminal. In accordance with this embodiment, lower land 216 forms the pad, sometimes called terminal, upon which a Ball Grid Array (BGA) solder bump is to be formed as discussed below.

Vias 208 electrically connect upper circuit pattern 204 to lower circuit pattern 206 through dielectric layer 202. Generally, vias 208 extend through dielectric layer 202 in a direction perpendicular to upper and lower surfaces 202U, 202L. Although a single via 208 is illustrated, in light of this disclosure, those of skill in the art will understand that flip chip bump structure 200 typically includes a plurality of vias 208. Further, although a single dielectric layer 202 is illustrated, in another embodiment, a multilayer substrate having a plurality of electrically conductive circuit patterns electrically interconnected by a plurality of vias is used.

In a form patterned buildup layer operation 102, a patterned buildup layer 218 is formed on upper surface 202U of dielectric layer 202. Patterned buildup layer 218 is a dielectric material such as solder mask or Ajinomoto Buildup Film (ABF). In one embodiment, the dielectric material is applied to upper surface 202U of dielectric layer 202 and then patterned, e.g., using a photo or laser imaging process, to form patterned buildup layer 218.

In accordance with this embodiment, patterned buildup layer 218 covers and electrically isolates upper traces 210, 214. Patterned buildup layer 218 includes a patterned buildup layer opening 220 that exposes at least a portion of upper trace 212.

In accordance with this embodiment, patterned buildup layer opening 220 has a width W2 larger than width W1 of upper trace 212. Accordingly, portions of upper surface 202U of dielectric layer 202 between upper trace 212 and patterned buildup layer 218 are exposed through patterned buildup layer opening 220. However, in another embodiment, upper trace 212 has a width W1A as indicated by the dashed lines that is greater than width W2 of patterned buildup layer opening 220 such that only upper trace 212 and not upper surface 202U of dielectric layer 202 is exposed through patterned buildup layer opening 220. For purposes of simplicity, upper trace 212 will be illustrated and discussed as having a width W1 although it is to be understood that upper trace 212 can have width W1A.

As illustrated in FIG. 2, patterned buildup layer opening 220 is a non solder mask defined opening, i.e., has a shape other than the shape of the flip chip bump to be formed. In the example illustrated in FIG. 2, patterned buildup layer opening 220 is shaped as a rectangular channel but has other shapes, e.g., is a circular opening, in other embodiments.

From form patterned buildup layer operation 102, flow moves to a form lower resist operation 104. In form lower resist operation 104, a lower resist 222 is formed on lower surface 202L of dielectric layer 202. Illustratively, lower resist 222 is blanket formed, i.e., non selectively, on lower surface 202U of dielectric layer 202 and covers and protects lower circuit pattern 206. Lower resist 222 is any one of a number of resists, e.g., photoresist, and the particular resist used is not essential to this embodiment.

Figure 3B:
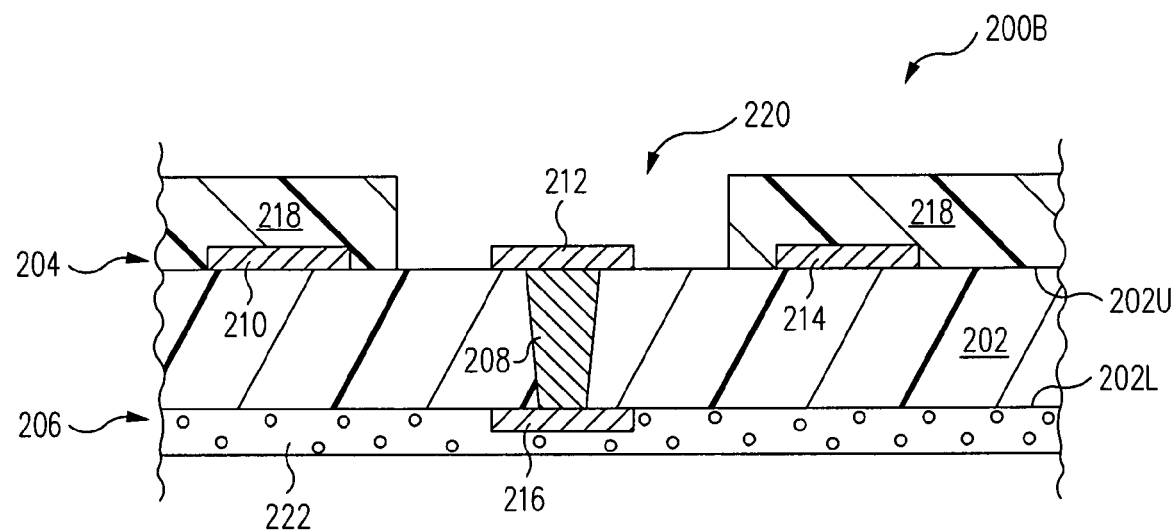
FIG. 3B is a cross-sectional view of a flip chip bump structure similar to the flip chip bump structure of FIG. 3A in accordance with an alternative embodiment.

FIG. 3B is a cross-sectional view of a flip chip bump structure 200B similar to flip chip bump structure 200 of FIG. 3A in accordance with an alternative embodiment. Referring now to FIGS. 3A and 3B together, flip chip bump structure 200B is substantially similar to flip chip bump structure 200 of FIG. 3A and only the significant differences are discussed below.

In FIG. 3A, circuit patterns 204, 206 are embedded within dielectric layer 202, i.e., are inward of planes defined by upper and lower surfaces 202U, 202L. Illustratively, laser ablated artifacts are formed within dielectric layer 202 using a laser ablation process and the laser ablated artifacts are filled with an electrically conductive material to form circuit patterns 204, 206.

In contrast, in FIG. 3B, circuit patterns 204, 206 are formed on top of upper and lower surfaces 202U, 202L of dielectric layer 202, i.e., are outward of planes defined by upper and lower surfaces 202U, 202L. Illustratively, electrically conductive layers, e.g., foil, are selectively etched to form upper and lower circuit patterns 204, 206 using any one of a number of techniques well known to those of skill in the art. In yet another embodiment, circuit patterns 204 and/or 206 can partially be embedded within dielectric layer 202 and can partially be on top of dielectric layer 202.

In the figures and following description, upper and lower circuit patterns 204, 206 are described and illustrated as being embedded within dielectric layer 202. However, in light of this disclosure, those of skill in art will understand that upper circuit pattern 204 and/or lower circuit pattern 206 can be embedded within dielectric layer 202, can be on top of dielectric layer 202, and/or can be partially embedded within and partially on top of dielectric layer 202.

FIG. 4 is a cross-sectional view of flip chip bump structure 200 of FIG. 3A at a further stage during fabrication in accordance with one embodiment. Referring now to FIGS. 1 and 4 together, from form lower resist operation 104, flow moves to a flash plate conductor layer operation 106. In flash plate conductor layer operation 106, a conductor layer 424 is blanket formed on an upper, e.g., first, surface 200U of flip chip structure 200. Conductor layer 424 is formed on patterned buildup layer 218 and within patterned buildup layer opening 220. More particularly, conductor layer 424 is formed on upper trace 212 and the portion of upper surface 202U exposed through patterned buildup layer opening 220. Conductor layer 424 can also be formed on lower resist 222 but would be removed when lower resist 222 is stripped as discussed below.

In one embodiment, conductor layer 424 is electroless plated copper although can be another electrical conductor in another embodiment. Illustratively, conductor layer 424 is called a seed layer.

FIG. 5 is a top plan view of flip chip bump structure 200 of FIG. 4 at a further stage during fabrication in accordance with one embodiment. FIG. 6 is a cross-sectional view of flip chip bump structure 200 of FIG. 5 along the line VI-VI in accordance with one embodiment. Referring now to FIGS. 1, 5 and 6 together, from flash plate conductor layer operation 106, flow moves to a form upper resist with flip chip bump openings operation 108. In form upper resist with flip chip bump openings operation 108, a patterned upper resist 526 having a plurality of flip chip bump openings is formed on upper surface 200U of flip chip bump structure 200. More particularly, patterned upper resist 526 is formed on conductor layer 424.

Patterned upper resist 526 includes a plurality of flip chip bump openings including a flip chip bump opening 528 that exposes a portion of conductor layer 424 above upper trace 212. As illustrated in FIGS. 5 and 6, flip chip bump opening 528 is a cylindrical opening in patterned upper resist 526.

In FIG. 5, upper trace 212 is illustrated by the dashed lines although it is to be understood that upper trace 212 would not be visible in the view of FIG. 5. Flip chip bump opening 528 has a diameter D1 less than width W2 of patterned buildup layer opening 220 yet greater than width W1 of upper trace 212. Generally, diameter D1 of flip chip bump opening 528 is selected based upon the desired diameter of the flip chip bump to be formed within flip chip bump opening 528 as discussed further below.

FIG. 7 is a cross-sectional view of flip chip bump structure 200 of FIG. 6 at a further stage during fabrication in accordance with one embodiment. Referring now to FIGS. 1 and 7 together, from form upper resist with flip chip bump openings operation 108, flow moves to a fill flip chip bump openings to form flip chip bumps operation 110. In fill flip chip bump openings to form flip chip bumps operation 110, the flip chip bump openings in patterned upper resist 526 are filled with an electrically conductive material to form a plurality of flip chip bumps. To illustrate, flip chip bump opening 528 is filled with an electrically conductive material to form an electrically conductive flip chip bump 630.

In one embodiment, copper is plated within flip chip bump opening 528 using conductor layer 424 as the electrode. In accordance with this embodiment, flip chip bump 630 is formed of plated copper.

Figure 8:
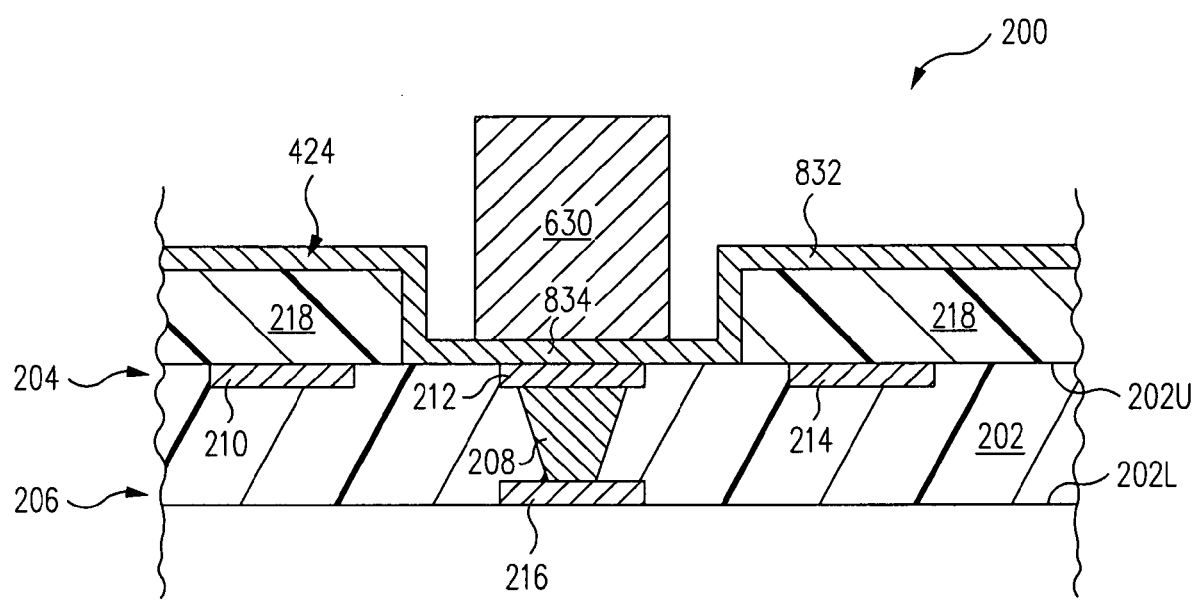
FIG. 8 is a cross-sectional view of the flip chip bump structure of FIG. 7 at a further stage during fabrication in accordance with one embodiment.

FIG. 8 is a cross-sectional view of flip chip bump structure 200 of FIG. 7 at a further stage during fabrication in accordance with one embodiment. Referring now to FIGS. 1, 7 and 8 together, from fill flip chip bump openings to form flip chip bumps operation 110, flow moves to a strip upper and lower resists operation 112. In strip upper and lower resists operation 112, patterned upper resist 526 and lower resist 222 are stripped, i.e., removed, using any one of a number of resist stripping techniques well known to those of skill in the art. This leaves conductor layer 424 exposed except for the portion of conductor layer 424 covered by flip chip bump 630. Stated another way, conductor layer 424 includes an exposed portion 832 that is exposed and a covered portion 834 that is covered by flip chip bump 630.

Figure 9:
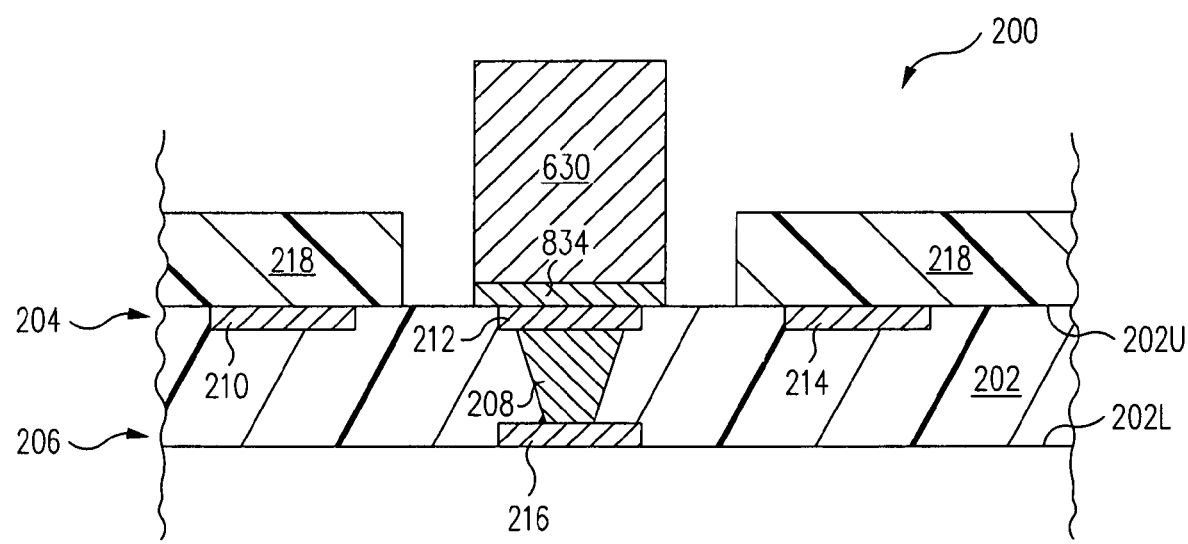
FIG. 9 is a cross-sectional view of the flip chip bump structure of FIG. 8 at a further stage during fabrication in accordance with one embodiment.

FIG. 9 is a cross-sectional view of flip chip bump structure 200 of FIG. 8 at a further stage during fabrication in accordance with one embodiment. Referring now to FIGS. 1, 8 and 9 together, from strip upper and lower resists operation 112, flow moves to a flash etch conductor layer operation 114. In flash etch conductor layer operation 114, exposed portion 832 of conductor layer 424 is flash etched, i.e., removed. Covered portion 834 and flip chip bump 630 formed thereon are not etched during the flash etch, i.e., to any significant degree. Accordingly, flip chip bump 630 is electrically and physically connected to upper trace 212 by covered portion 834.

Figure 10:
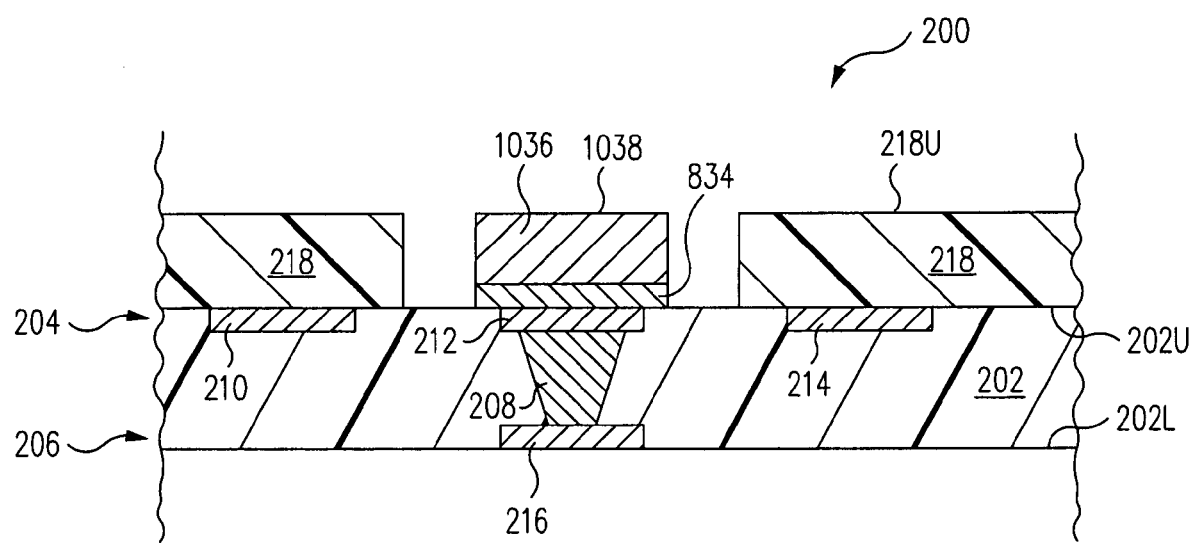
FIG. 10 is a cross-sectional view of the flip chip bump structure of FIG. 9 at a further stage during fabrication in accordance with one embodiment.

FIG. 10 is a cross-sectional view of flip chip bump structure 200 of FIG. 9 at a further stage during fabrication in accordance with one embodiment. Referring now to FIGS. 1, 9, and 10 together, from flash etch conductor layer operation 114, flow moves, optionally, to a planarize flip chip bumps operation 116. In planarize flip chip bumps operation 116, the flip chip bumps are planarized, e.g., using a grinding process to form planarize flip chip bumps. To illustrate, flip chip bump 630 is planarized to form a planarized flip chip bump 1036. More particularly, planarized flip chip bump 1036 includes an exterior surface 1038 that is coplanar with an upper, e.g., first, surface 218U of patterned buildup layer 218.

In various embodiments, a final finish is applied to flip chip bump 630 (FIG. 9) and/or planarized flip chip bump 1036 (FIG. 10). Illustratively, the final finish protects flip chip bump 630 and/or planarized flip chip bump 1036, e.g., prevents oxidation thereof. For example, the final finish is an Organic Solderability Protectant (OSP) or other protectant. In another embodiment, the final finish enhances solder wetability of flip chip bump 630 and/or planarized flip chip bump 1036 facilitating formation of a solder joint therewith. For example, the final finish is gold, solder, or other solder enhancer.

As set forth above, planarize flip chip bumps operation 116 is optional, and in one embodiment, is not performed. For example, flip chip bump 630 protrudes outwards and beyond patterned buildup layer 218 providing a standoff for an electronic component flip chip mounted to flip chip bump 630 at set forth below in reference to FIG. 11.

Figure 11:
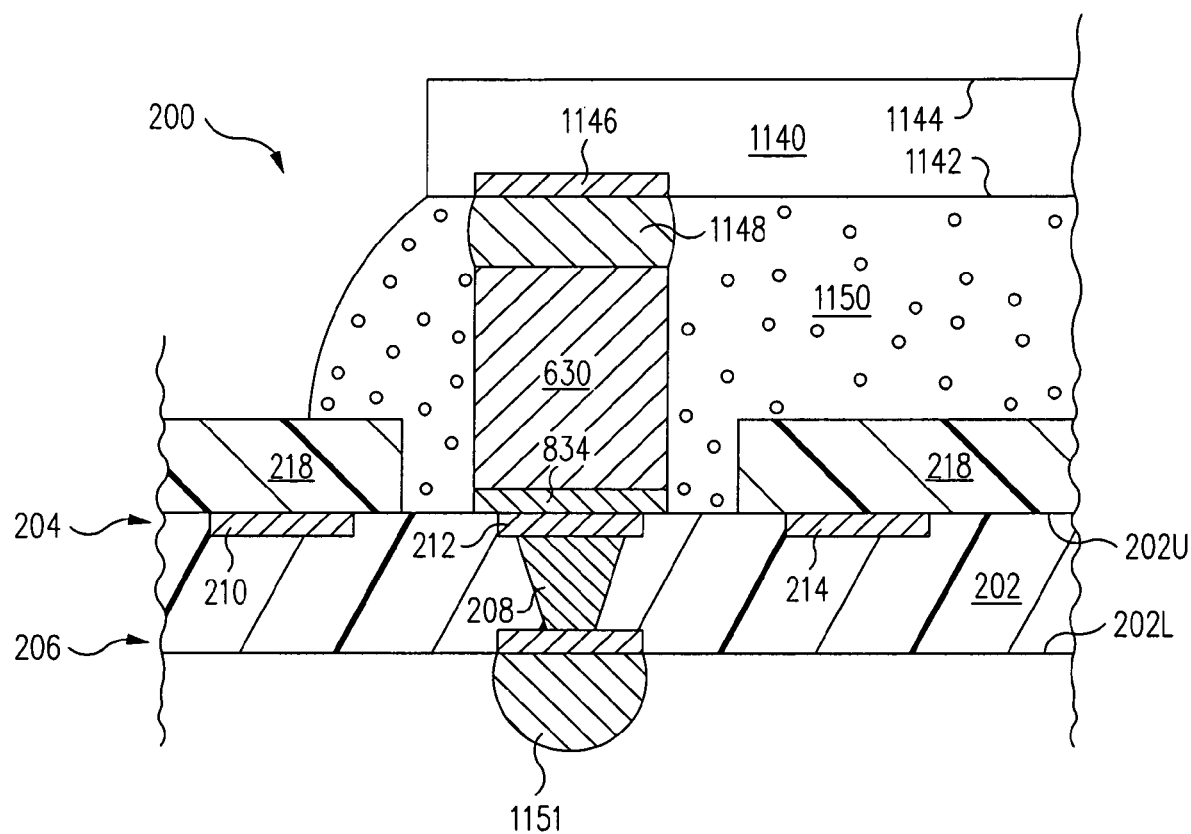
FIG. 11 is a cross-sectional view of the flip chip bump structure of FIG. 9 in accordance with one embodiment.

FIG. 11 is a cross-sectional view of flip chip bump structure 200 of FIG. 9 in accordance with one embodiment. Referring now to FIG. 11, an electronic component 1140, e.g., an integrated circuit chip, is flip chip mounted to flip chip bump 630. In accordance with this embodiment, electronic component 1140 includes an active surface 1142 and an inactive surface 1144. Active surface 1142 includes a plurality of bond pads 1146 formed thereon. Bond pads 1146 are physically and electrically flip chip mounted to flip chip bumps 630 by solder bumps 1148.

As flip chip bumps 630 protrude beyond patterned buildup layer 218, flip chip bumps 630 provide a standoff (distance) between active surface 1142 of electronic component 1140 and patterned buildup layer 218. This facilitates application of an underfill material 1150 between active surface 1142 of electronic component 1140 and patterned buildup layer 218. Underfill material 1150 encloses and protects flip chip bump 630 including solder bump 1148. Underfill material 1150 absorbs stress, e.g., due to thermal coefficient of expansion (TCE) mismatch between electronic component 1140 and dielectric layer 202 thus enhancing the reliability of the flip chip mounting of electronic component 1140. However, in another embodiment, underfill material 1150 is not applied.

As also illustrated in FIG. 11, an interconnection ball 1151, sometimes called a solder ball or BGA ball, is formed on lower land 216. Interconnection ball 1151 allows for electrical interconnection of flip chip bump structure 200 to a larger substrate, e.g., a printed circuit motherboard. However, interconnection ball 1151 is optional and in one embodiment is not formed.

FIGS. 1 through 11 provide an example of a non solder mask defined (NSMD) flip chip bump formation method 100 in accordance with one embodiment. More particularly, flip chip bumps 630 are not defined by patterned buildup layer 218, e.g., a solder mask. In contrast, flip chip bumps 630 are defined by patterned upper resist 526 (FIGS. 5, 6), which can be patterned to have flip chip bump openings 528 with extremely small pitch, e.g., of less than 130 μm. Accordingly, flip chip bump formation method 100 is extremely well-suited for formation of high-density substrates.

In accordance with another embodiment, flip chip bump formation method 100 is also representative of a solder mask defined (SMD) flip chip bump formation method. More particularly, FIGS. 1, 12-25 provide examples of a solder mask defined (SMD) flip chip bump formation method 100 in accordance with various embodiments.

Figure 12:
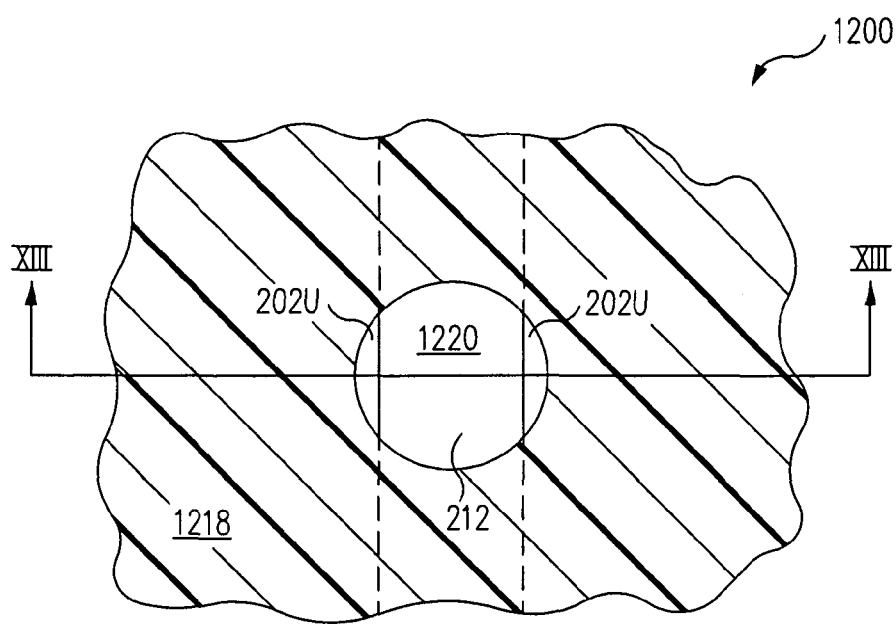
FIG. 12 is a top plan view of a flip chip bump structure during fabrication in accordance with one embodiment.
Figure 13:
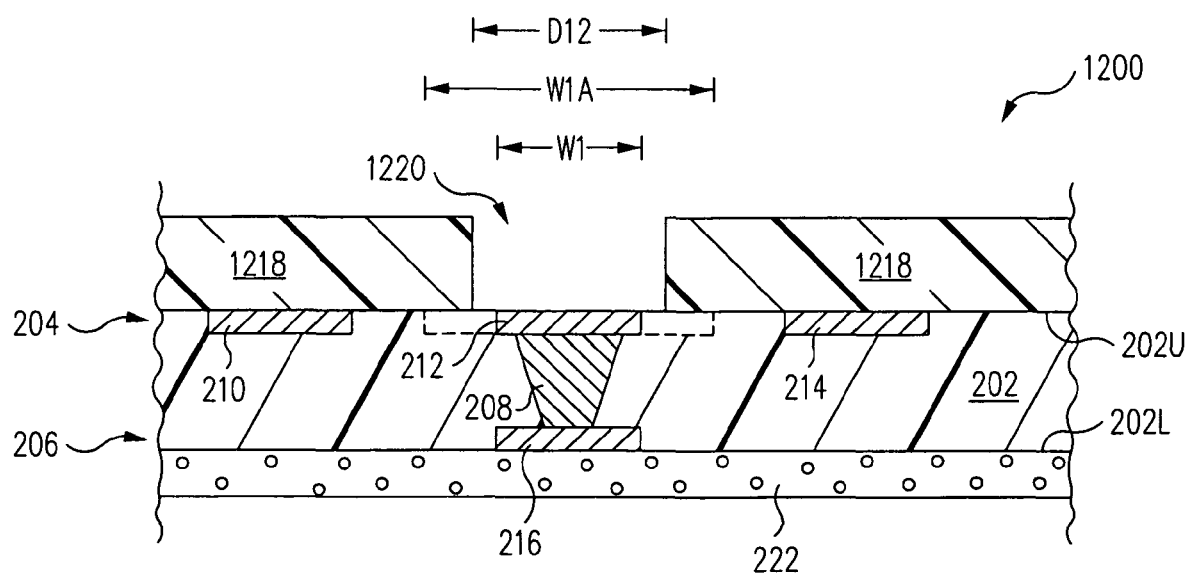
FIG. 13 is a cross-sectional view of the flip chip bump structure of FIG. 12 along the line XIII-XIII in accordance with one embodiment.

FIG. 12 is a top plan view of a flip chip bump structure 1200 during fabrication in accordance with one embodiment. FIG. 13 is a cross-sectional view of flip chip bump structure 1200 of FIG. 12 along the line XIII-XIII in accordance with one embodiment. Flip chip bump structure 1200 of FIGS. 12, 13 is similar to flip chip bump structure 200 of FIGS. 2, 3A and only the significant differences between flip chip bump structure 1200 and flip chip bump structure 200 are discussed below.

Referring now to FIGS. 1, 12 and 13 together, flip chip bump structure 1200 includes dielectric layer 202, upper circuit pattern 204 including upper traces 210, 212, 214, lower circuit pattern 206 including lower land 216, and electrically conductive vias 208.

In form patterned buildup layer operation 102, a patterned buildup layer 1218 is formed on upper surface 202U of dielectric layer 202. Patterned buildup layer 1218 is a dielectric material such as solder mask or Ajinomoto Buildup Film (ABF). In one embodiment, the dielectric material is applied to upper surface 202U of dielectric layer 202 and then patterned, e.g., using a photo or laser imaging process, to form patterned buildup layer 1218.

In accordance with this embodiment, patterned buildup layer 1218 covers and electrically isolates upper traces 210, 214. Patterned buildup layer 1218 includes a patterned buildup layer opening 1220 that exposes at least a portion of upper trace 212.

In accordance with this embodiment, patterned buildup layer opening 1220 is a cylindrical opening in patterned buildup layer 1218. Patterned buildup layer opening 1220 has a diameter D12 larger than width W1 of upper trace 212. Accordingly, portions of upper surface 202U of dielectric layer 202 between upper trace 212 and patterned buildup layer 1218 are exposed through patterned buildup layer opening 1220. However, in another embodiment, upper trace 212 has a width W1A as indicated by the dashed lines that is greater than diameter D12 of patterned buildup layer opening 1220 such that only upper trace 212 and not upper surface 202U of dielectric layer 202 is exposed through patterned buildup layer opening 1220. For purposes of simplicity, upper trace 212 will be illustrated and discussed as having a width W1 although it is to be understood that upper trace 212 can have width W1A.

As illustrated in FIG. 12, patterned buildup layer opening 1220 is solder mask defined opening, i.e., has a shape of the flip chip bump to be formed.

From form patterned buildup layer operation 102, flow moves to form lower resist operation 104. In form lower resist operation 104, lower resist 222 is formed on lower surface 202L of dielectric layer 202.

Figure 14:
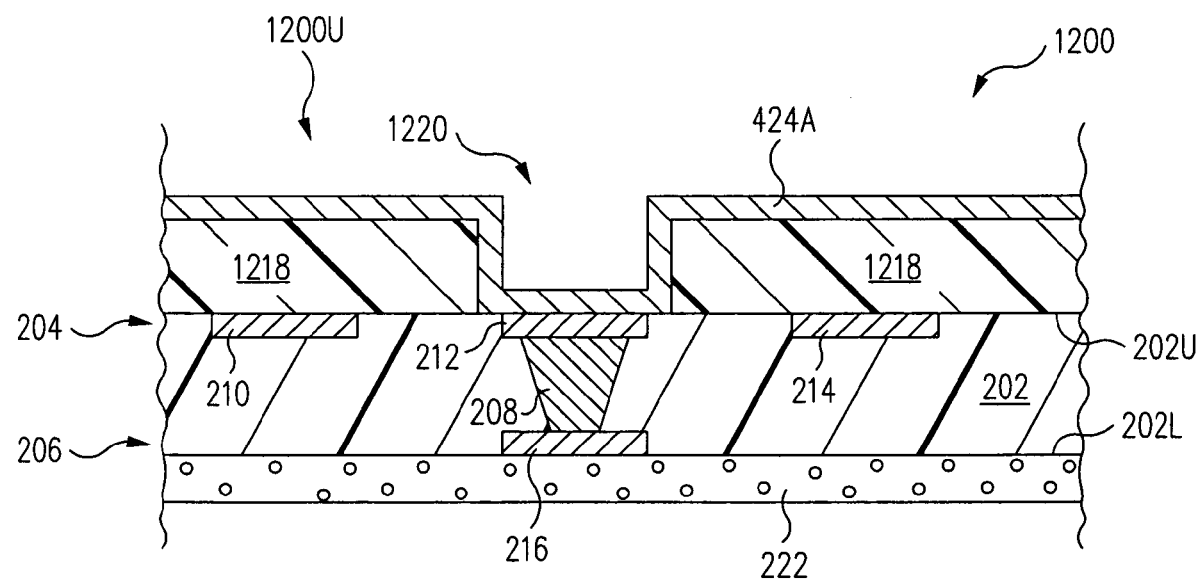
FIG. 14 is a cross-sectional view of the flip chip bump structure of FIG. 13 at a further stage during fabrication in accordance with one embodiment.

FIG. 14 is a cross-sectional view of flip chip bump structure 1200 of FIG. 13 at a further stage during fabrication in accordance with one embodiment. Referring now to FIGS. 1 and 14 together, from form lower resist operation 104, flow moves to flash plate conductor layer operation 106. In flash plate conductor layer operation 106, a conductor layer 424A is blanket formed on an upper, e.g., first, surface 1200U of flip chip bump structure 1200. Conductor layer 424A is formed on patterned buildup layer 1218 and within patterned buildup layer opening 1220. More particularly, conductor layer 424A is formed on upper trace 212 and the portion of upper surface 202U exposed through patterned buildup layer opening 1220.

In one embodiment, conductor layer 424A is similar to conductor layer 424 of FIG. 4 and so is not described in further detail.

Figure 15:
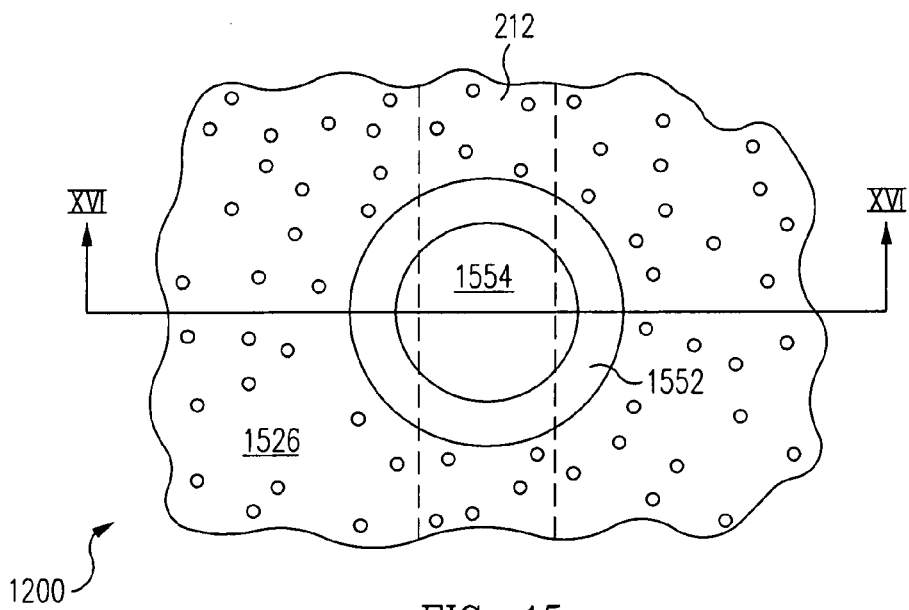
FIG. 15 is a top plan view of the flip chip bump structure of FIG. 14 at a further stage during fabrication in accordance with one embodiment.
Figure 16:
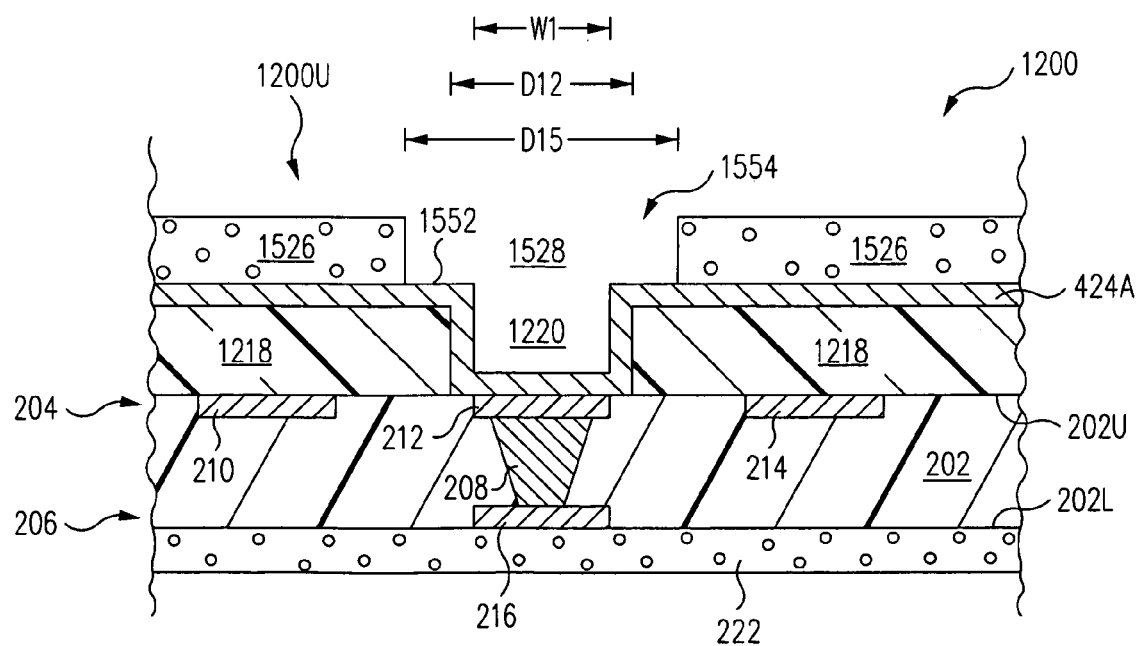
FIG. 16 is a cross-sectional view of the flip chip bump structure of FIG. 15 along the line XVI-XVI in accordance with one embodiment.

FIG. 15 is a top plan view of flip chip bump structure 1200 of FIG. 14 at a further stage during fabrication in accordance with one embodiment. FIG. 16 is a cross-sectional view of flip chip bump structure 1200 of FIG. 15 along the line XVI-XVI in accordance with one embodiment. Referring now to FIGS. 1, 15 and 16 together, from flash plate conductor layer operation 106, flow moves to form upper resist with flip chip bump openings operation 108. In form upper resist with flip chip bump openings operation 108, a patterned upper resist 1526 having a plurality of flip chip bump openings is formed on upper surface 1200U of flip chip bump structure 1200. More particularly, patterned upper resist 1526 is formed on conductor layer 424A.

Patterned upper resist 1526 includes a plurality of flip chip bump openings including a flip chip bump opening 1528 that exposes a portion of conductor layer 424A above upper trace 212. As illustrated in FIGS. 15 and 16, flip chip bump opening 1528 is a cylindrical opening in patterned upper resist 1526.

In FIG. 15, upper trace 212 is illustrated by the dashed lines although it is to be understood that upper trace 212 would not be visible in the view of FIG. 15. Flip chip bump opening 1528 has a diameter D15 greater than diameter D12 of patterned buildup layer opening 1220 and greater than width W1 of upper trace 212 to compensate for registration tolerances between flip chip bump opening 1528 and patterned buildup layer opening 1220. Flip chip bump opening 1528 is concentric with patterned buildup layer opening 1220 although may be slightly misaligned due to the registration tolerances (allowable misalignment) between flip chip bump opening 1528 and patterned buildup layer opening 1220.

Accordingly, an annular surface 1552 is exposed through flip chip bump opening 1528. Annular surface 1552 is the portion of patterned buildup layer 1218 and overlying conductor layer 424A surrounding patterned buildup layer opening 1220.

Annular surface 1552 is coplanar with upper surface 202U of dielectric layer 202. Generally, annular surface 1552 extends horizontally outward from patterned buildup layer opening 1220 to patterned upper resist 1526.

Generally, patterned buildup layer opening 1220 and flip chip bump opening 1528 define a variable diameter opening 1554 extending through both patterned buildup layer 1218 and patterned upper resist 1526. More particularly, variable diameter opening 1554 has a first lower portion defined by patterned buildup layer opening 1220 having diameter D12 and a second upper portion defined by flip chip bump opening 1528 having diameter D15.

Figure 17:
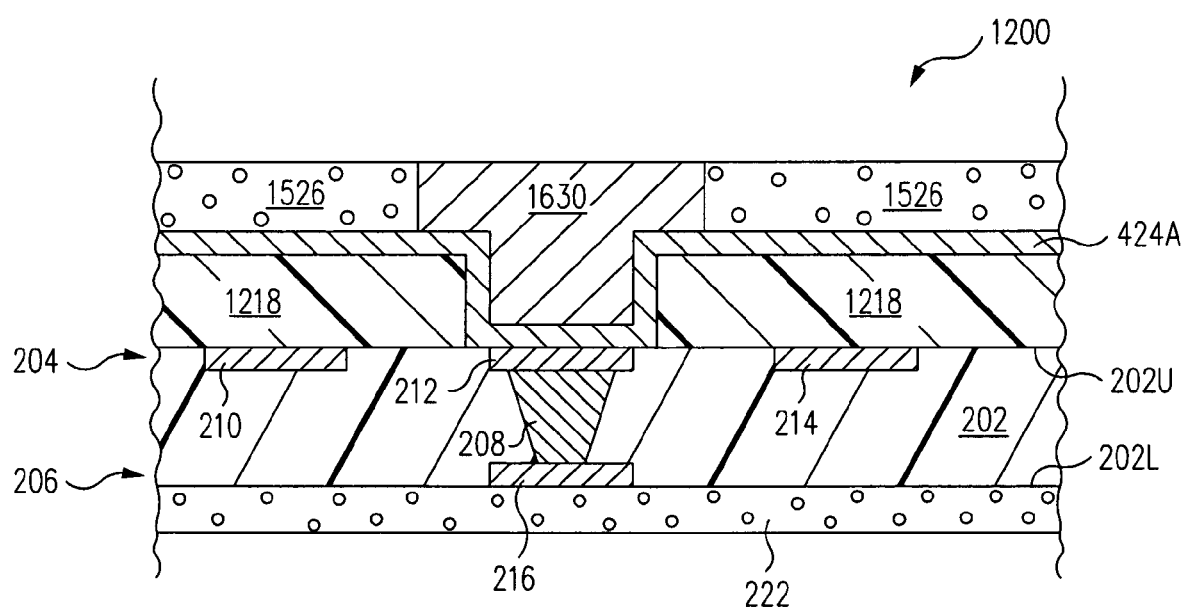
FIG. 17 is a cross-sectional view of the flip chip bump structure of FIG. 16 at a further stage during fabrication in accordance with one embodiment.

FIG. 17 is a cross-sectional view of flip chip bump structure 1200 of FIG. 16 at a further stage during fabrication in accordance with one embodiment. Referring now to FIGS. 1, 16 and 17 together, from form upper resist with flip chip bump openings operation 108, flow moves to fill flip chip bump openings to form flip chip bumps operation 110. In fill flip chip bump openings to form flip chip bumps operation 110, the flip chip bump openings in patterned upper resist 1526 are filled with an electrically conductive material to form a plurality of flip chip bumps. To illustrate, flip chip bump opening 1528 is filled with an electrically conductive material to form an electrically conductive flip chip bump 1630. More particularly, variable diameter opening 1554 is filled with an electrically conductive material to form an electrically conductive flip chip bump 1630.

In one embodiment, copper is plated within variable diameter opening 1554 using conductor layer 424A as the electrode. In accordance with this embodiment, flip chip bump 1630 is formed of plated copper.

Flip chip bump 1630 has a variable diameter corresponding to variable diameter opening 1554. More particularly, flip chip bump 1630 has a first lower portion within patterned buildup layer opening 1220 having diameter D12 and a second upper portion within flip chip bump opening 1528 having diameter D15.

Figure 18:
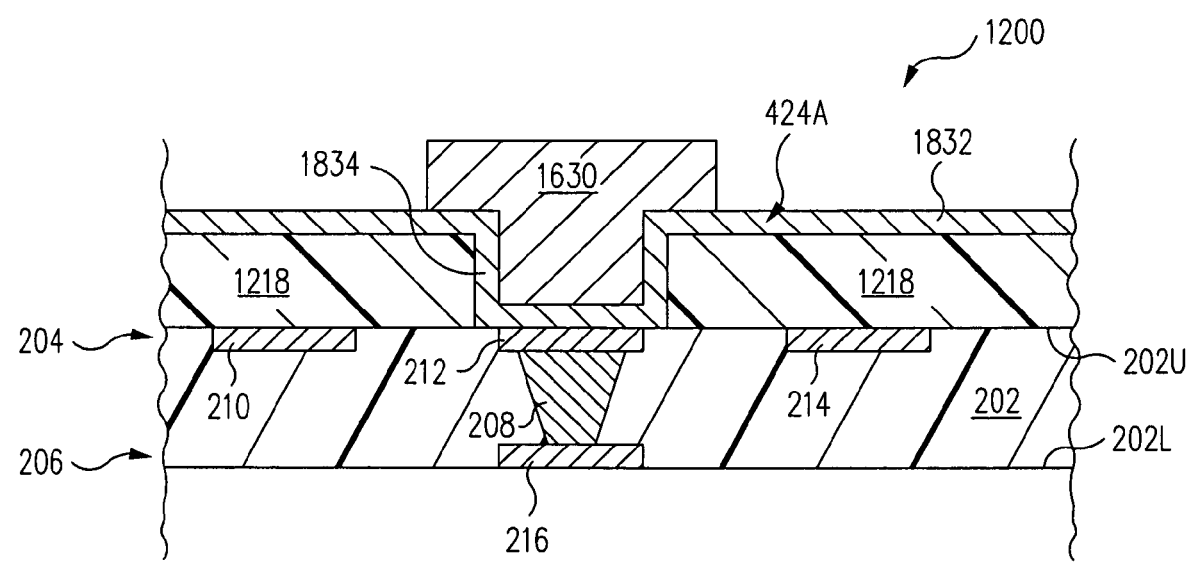
FIG. 18 is a cross-sectional view of the flip chip bump structure of FIG. 17 at a further stage during fabrication in accordance with one embodiment.

FIG. 18 is a cross-sectional view of flip chip bump structure 1200 of FIG. 17 at a further stage during fabrication in accordance with one embodiment. Referring now to FIGS. 1, 17 and 18 together, from fill flip chip bump openings to form flip chip bumps operation 110, flow moves to strip upper and lower resists operation 112. In strip upper and lower resists operation 112, patterned upper resist 1526 and lower resist 222 are stripped, i.e., removed, using any one of a number of resist stripping techniques well known to those of skill in art. This leaves conductor layer 424A exposed except for the portion of conductor layer 424A covered by flip chip bump 1630. Stated another way, conductor layer 424A includes an exposed portion 1832 that is exposed and a covered portion 1834 that is covered by flip chip bump 1630.

Figure 19:
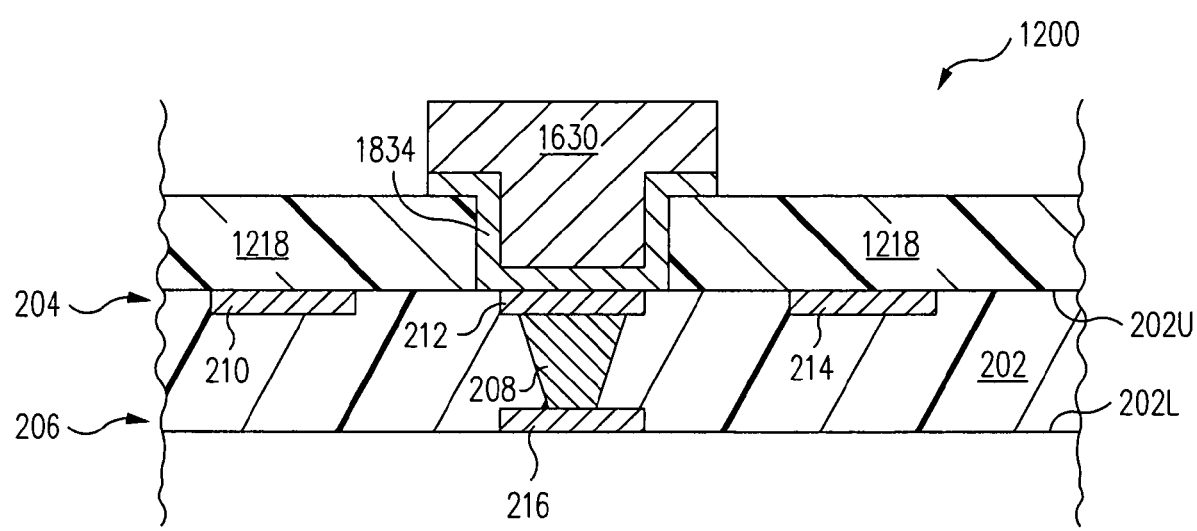
FIG. 19 is a cross-sectional view of the flip chip bump structure of FIG. 18 at a further stage during fabrication in accordance with one embodiment.

FIG. 19 is a cross-sectional view of flip chip bump structure 1200 of FIG. 18 at a further stage during fabrication in accordance with one embodiment. Referring now to FIGS. 1, 18 and 19 together, from strip upper and lower resists operation 112, flow moves to flash etch conductor layer operation 114. In flash etch conductor layer operation 114, exposed portion 1832 of conductor layer 424A is flash etched, i.e., removed. Covered portion 1834 and flip chip bump 1630 formed thereon are not etched during the flash etch to any significant degree. As illustrated, flip chip bump 1630 extends horizontally outward and over buildup dielectric layer 1218.

Figure 20:
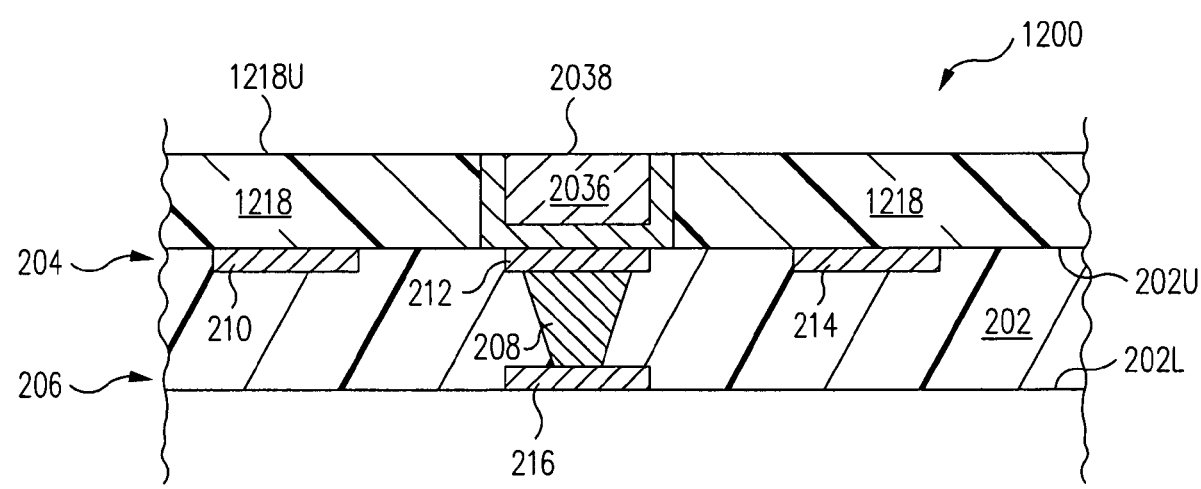
FIG. 20 is a cross-sectional view of the flip chip bump structure of FIG. 19 at a further stage during fabrication in accordance with one embodiment.

FIG. 20 is a cross-sectional view of flip chip bump structure 1200 of FIG. 19 at a further stage during fabrication in accordance with one embodiment. Referring now to FIGS. 1, 19, and 20 together, from flash etch conductor layer operation 114, flow moves, optionally, to planarize flip chip bumps operation 116. In planarize flip chip bumps operation 116, the flip chip bumps are planarized, e.g., using a grinding process, to form planarize flip chip bumps. To illustrate, flip chip bump 1630 is planarize to form a planarized flip chip bump 2036. More particularly, planarized flip chip bump 2036 includes an exterior surface 2038 that is coplanar with an upper, e.g., first, surface 1218U of patterned buildup layer 1218.

In various embodiments, a final finish is applied to flip chip bump 1630 (FIG. 19) and/or planarized flip chip bump 2036 (FIG. 20). Illustratively, the final finish protects flip chip bump 1630 and/or planarized flip chip bump 2036, e.g., prevents oxidation thereof.

As set forth above, planarize flip chip bumps operation 116 is optional, and in one embodiment, is not performed. For example, flip chip bump 1630 protrudes outwards and beyond patterned buildup layer 1218 providing a standoff for an electronic component flip chip mounted to flip chip bump 1630 in a manner similar to that set forth above in reference to FIG. 11.

In accordance with another embodiment, FIGS. 1, 21-25 provide another example of a solder mask defined (SMD) flip chip bump formation method 100.

Figure 21:
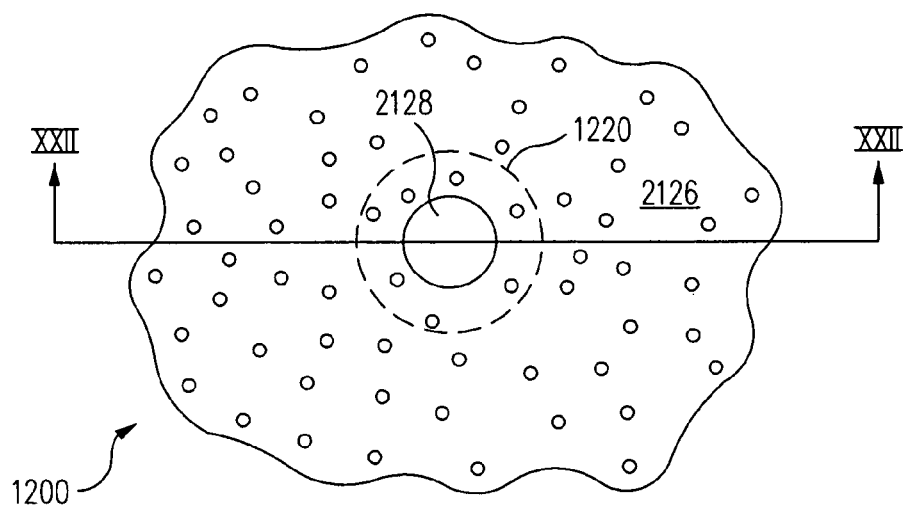
FIG. 21 is a top plan view of the flip chip bump structure of FIG. 14 at a later stage during fabrication in accordance with another embodiment.
Figure 22:
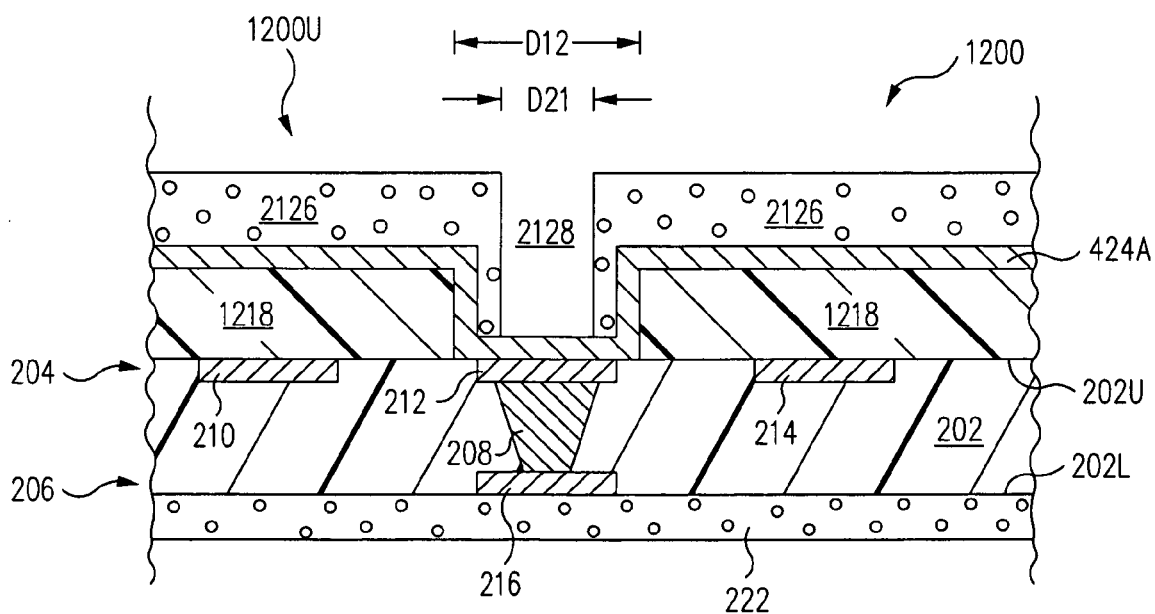
FIG. 22 is a cross-sectional view of the flip chip bump structure of FIG. 21 along the line XXII-XXII in accordance with one embodiment.

FIG. 21 is a top plan view of a flip chip bump structure 1200 of FIG. 14 at a later stage during fabrication in accordance with another embodiment. FIG. 22 is a cross-sectional view of flip chip bump structure 1200 of FIG. 21 along the line XXII-XXII in accordance with one embodiment.

Referring now to FIGS. 1, 21 and 22 together, from flash plate conductor layer operation 106, flow moves to form upper resist with flip chip bump openings operation 108. In form upper resist with flip chip bump openings operation 108, a patterned upper resist 2126 having a plurality of flip chip bump openings is formed on upper surface 1200U of flip chip bump structure 1200. More particularly, patterned upper resist 2126 is formed on conductor layer 424A.

Patterned upper resist 2126 includes a plurality of flip chip bump openings including a flip chip bump opening 2128 that exposes a portion of conductor layer 424A above upper trace 212. As illustrated in FIGS. 21 and 22, flip chip bump opening 2128 is a cylindrical opening in patterned upper resist 2126.

In FIG. 21, patterned buildup layer opening 1220 is illustrated by the dashed circle although it is to be understood that patterned buildup layer opening 1220 would not be visible in the view of FIG. 21. Flip chip bump opening 2128 has a diameter D21 less than diameter D12 of patterned buildup layer opening 1220 to compensate for registration tolerances between flip chip bump opening 2128 and patterned buildup layer opening 1220. Flip chip bump opening 2128 is concentric with patterned buildup layer opening 1220 although may be slightly misaligned due to the registration tolerances (allowable misalignment) between flip chip bump opening 2128 and patterned buildup layer opening 1220.

Generally, flip chip bump opening 2128 extends through patterned buildup layer opening 1220. More particularly, patterned upper resist 2126 fills patterned buildup layer opening 1220 except for flip chip bump opening 2128. Flip chip bump opening 2128 exposes only a portion of conductor layer 424A exposed by patterned buildup layer opening 1220.

Figure 23:
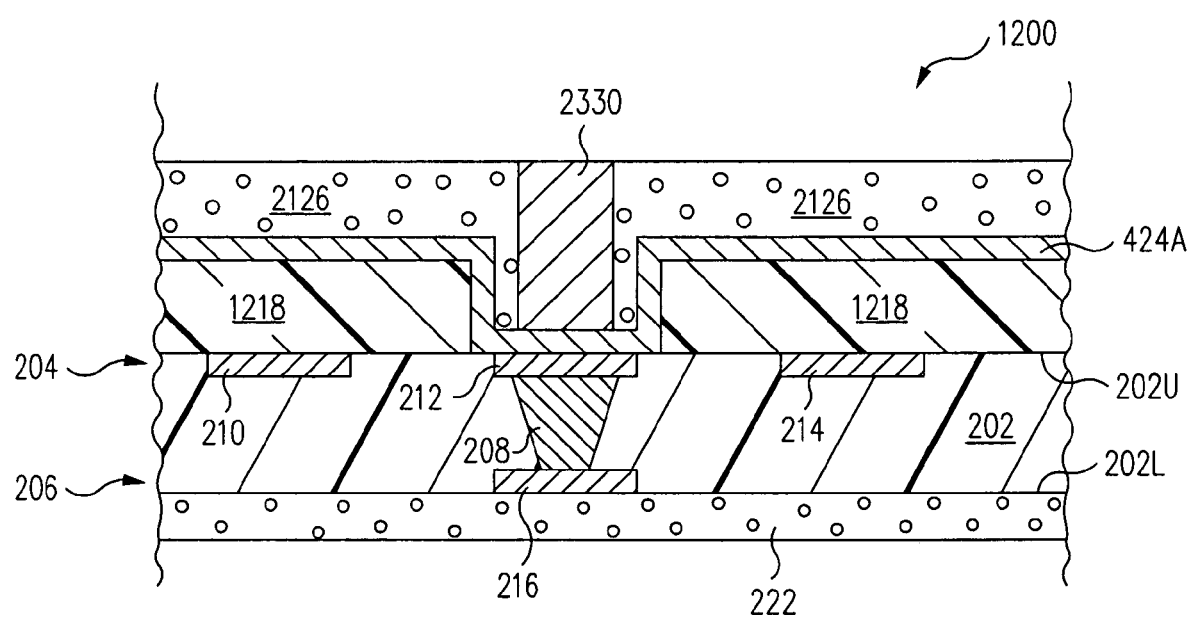
FIG. 23 is a cross-sectional view of the flip chip bump structure of FIG. 22 at a further stage during fabrication in accordance with one embodiment.

FIG. 23 is a cross-sectional view of flip chip bump structure 1200 of FIG. 22 at a further stage during fabrication in accordance with one embodiment. Referring now to FIGS. 1, 22 and 23 together, from form upper resist with flip chip bump openings operation 108, flow moves to fill flip chip bump openings to form flip chip bumps operation 110. In fill flip chip bump openings to form flip chip bumps operation 110, the flip chip bump openings in patterned upper resist 2126 are filled with an electrically conductive material to form a plurality of flip chip bumps. To illustrate, flip chip bump opening 2128 is filled with an electrically conductive material to form an electrically conductive flip chip bump 2330.

In one embodiment, copper is plated within flip chip bump opening 2128 using conductor layer 424A as the electrode. In accordance with this embodiment, flip chip bump 2330 is formed of plated copper.

Flip chip bump 2330 has diameter D21 corresponding to flip chip bump opening 2128.

Figure 24:
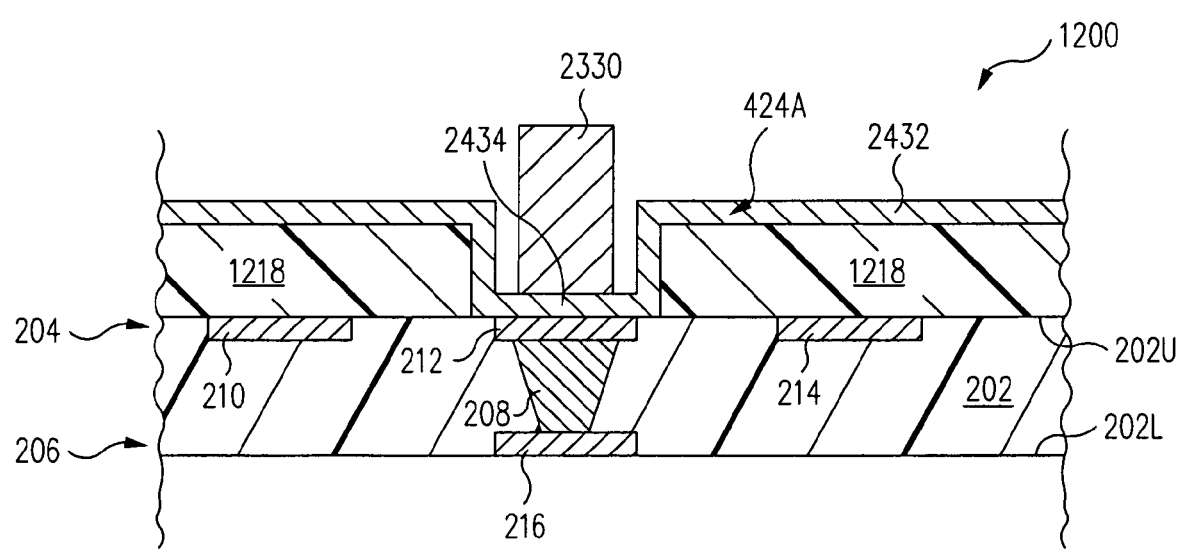
FIG. 24 is a cross-sectional view of the flip chip bump structure of FIG. 23 at a further stage during fabrication in accordance with one embodiment.

FIG. 24 is a cross-sectional view of flip chip bump structure 1200 of FIG. 23 at a further stage during fabrication in accordance with one embodiment. Referring now to FIGS. 1, 23 and 24 together, from fill flip chip bump openings to form flip chip bumps operation 110, flow moves to strip upper and lower resists operation 112. In strip upper and lower resists operation 112, patterned upper resist 2126 and lower resist 222 are stripped, i.e., removed, using any one of a number of resist stripping techniques well known to those of skill in art. This leaves conductor layer 424A exposed except for the portion of conductor layer 424A covered by flip chip bump 2330. Stated another way, conductor layer 424A includes an exposed portion 2432 that is exposed and a covered portion 2434 that is covered by flip chip bump 2330.

Figure 25:
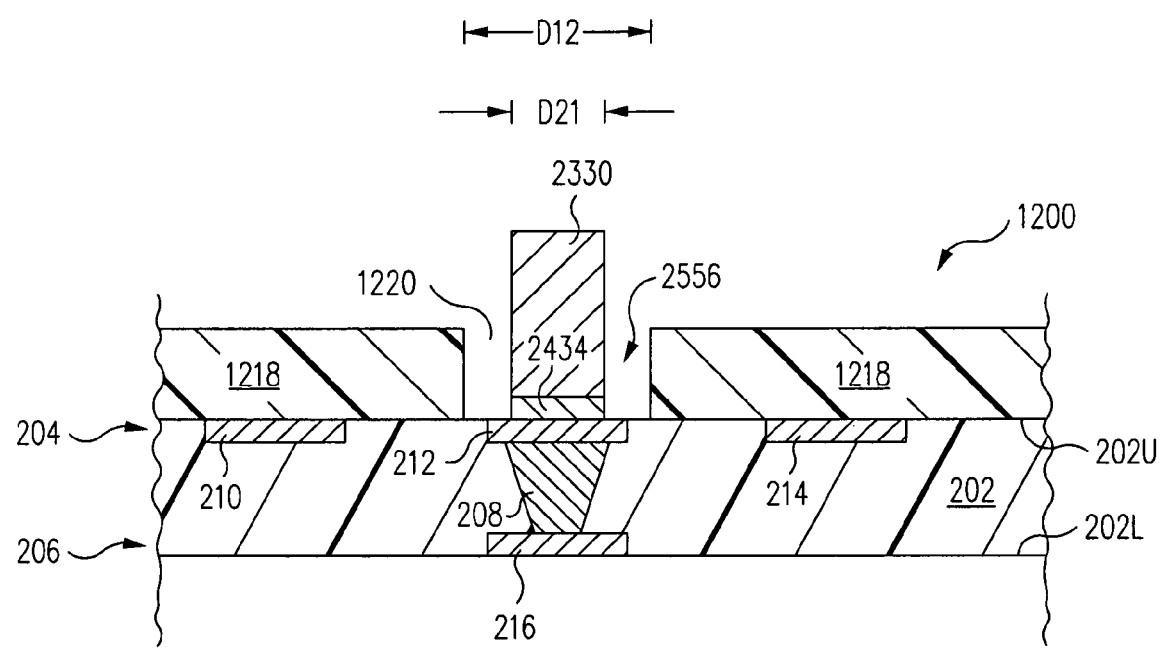
FIG. 25 is a cross-sectional view of the flip chip bump structure of FIG. 24 at a further stage during fabrication in accordance with one embodiment.

FIG. 25 is a cross-sectional view of flip chip bump structure 1200 of FIG. 24 at a further stage during fabrication in accordance with one embodiment. Referring now to FIGS. 1, 24 and 25 together, from strip upper and lower resists operation 112, flow moves to flash etch conductor layer operation 114. In flash etch conductor layer operation 114, exposed portion 2432 of conductor layer 424A is flash etched, i.e., removed. Covered portion 2434 and flip chip bump 2330 formed thereon are not etched during the flash etch to any significant degree.

As illustrated in FIG. 25, flip chip bump 2330 is contained within patterned buildup layer opening 1220. Stated another way, flip chip bump 2330 extends outwards from upper trace 212 through patterned buildup layer 1218 and protrudes therefrom. Optionally, planarize flip chip bumps operation 116 is performed to planarize flip chip bump 2330.

Further, a gap 2556 between flip chip bump 2330 and patterned buildup layer 1218 exists. More particularly, diameter D21 of flip chip bump 2330 is less than diameter D12 of patterned buildup layer opening 1220 such that flip chip bump 2330 is contained within patterned buildup layer opening 1220 and spaced apart from patterned buildup layer 1218.

Figure 26:
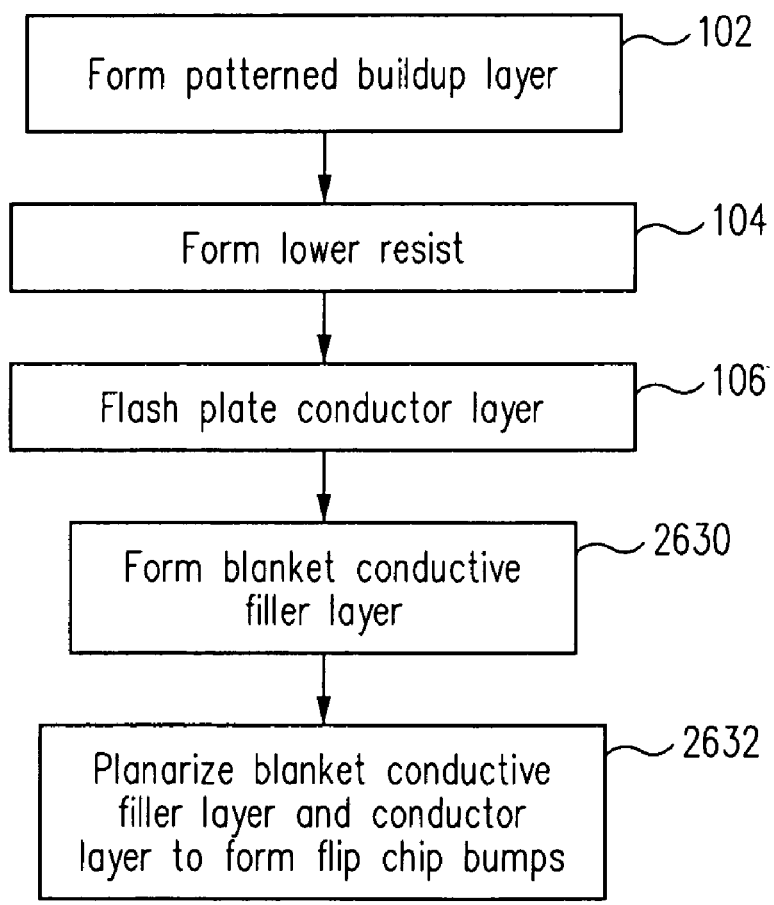
FIG. 26 is a flip chip bump formation method in accordance with another embodiment.

FIG. 26 is a flip chip bump formation method 2600 in accordance with another embodiment. Flip chip bump formation method 2600 includes form patterned buildup layer operation 102, form lower resist operation 104, and flash plate conductor layer operation 106 that are substantially similar or identical to form patterned buildup layer operation 102, form lower resist operation 104, and flash plate conductor layer operation 106 of flip chip bump formation method 100 of FIG. 1 and so are only briefly repeated here.

More particularly, referring now to FIGS. 26, 12 and 13 together, in form patterned buildup layer operation 102, patterned buildup layer 1218 including patterned buildup layer opening 1220 is formed as described above. In form lower resist operation 104, lower resist 222 is formed as described above.

Referring now to FIGS. 26 and 14 together, in flash plate conductor layer operation 106, conductor layer 424A is flash plated as described above resulting in flip chip bump structure 1200 as illustrated in FIG. 14.

Figure 27:
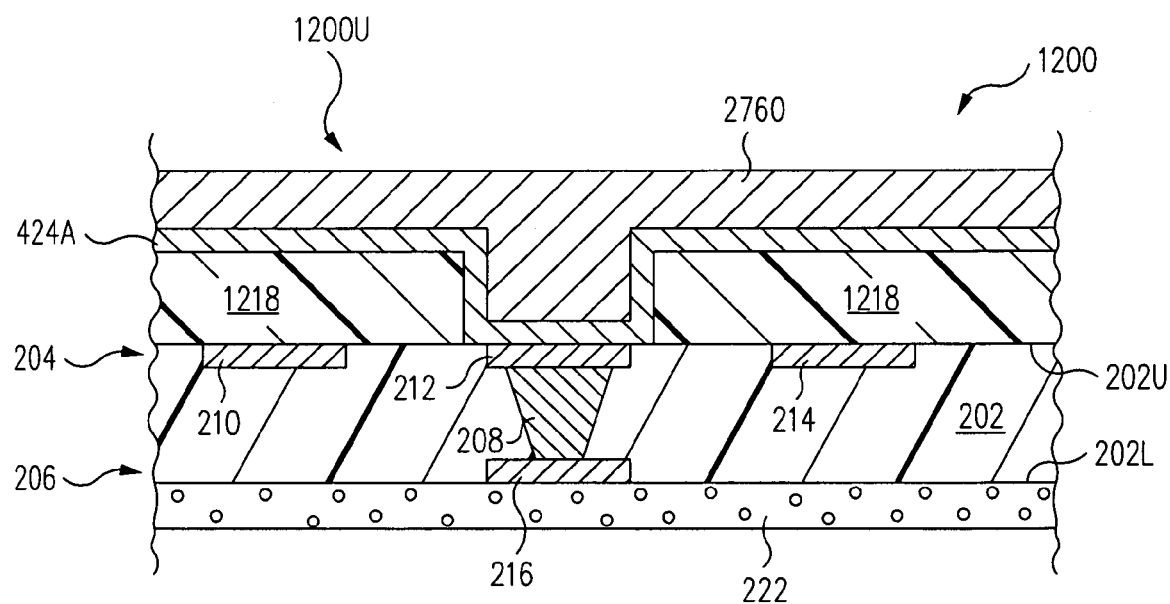
FIG. 27 is a cross-sectional view of flip chip bump structure of FIG. 14 at a further stage during fabrication in accordance with one embodiment.

FIG. 27 is a cross-sectional view of flip chip bump structure 1200 of FIG. 14 at a further stage during fabrication in accordance with one embodiment. Referring now to FIGS. 14, 26 and 27 together, from flash plate conductor layer operation 106, flow moves to a form blanket conductive filler layer operation 2630. In form blanket conductive filler layer operation 2630, a blanket conductive filler layer 2760 is blanket formed on upper surface 1200U of flip chip bump structure 1200. Blanket conductive filler layer 2760 is formed by blanket plating a conductive material such as copper non-selectively to cover upper surface 1200U of flip chip bump structure 1200. Illustratively, blanket conductive filler layer 2760 is blanket plated using conductor layer 424A as the electrode.

Blanket conductive filler layer 2760 thus covers the entire upper surface 1200U of flip chip bump structure 1200. Further, blanket conductive filler layer 2760 fills patterned buildup layer opening 1220 (FIG. 14).

From form blanket conductive filler layer operation 2630, flow moves to a planarize blanket conductive filler layer and conductor layer to form flip chip bumps operation 2632. FIG. 20 is a cross-sectional view of flip chip bump structure 1200 of FIG. 27 at a further stage during fabrication in accordance with this embodiment. Referring now to FIGS. 20, 26 and 27 together, in planarize blanket conductive filler layer and conductor layer to form flip chip bumps operation 2632, blanket conductive filler layer 2760 and conductor layer 424A are planarized to expose upper surface 1218U of patterned buildup layer 1218. In various embodiments, blanket conductive filler layer 2760 and conductor layer 424A are planarized using an etch process and/or a grinding process.

The portions of blanket conductive filler layer 2760 and conductor layer 424A remaining in patterned buildup layer opening 1220 (see FIG. 13) form planarized flip chip bump 2036 as illustrated in FIG. 20. More particularly, planarized flip chip bump 2036 includes exterior surface 2038 that is coplanar with upper surface 1218U of patterned buildup layer 1218. Using flip chip bump formation method 2600, planarized flip chip bump 2036 is self-aligned. Lower resist 222 is striped before or after planarize blanket conductive filler layer and conductor layer to form flip chip bumps operation 2632 to form flip chip bump structure 1200 of FIG. 20. An electronic component is flip chip mounted to flip chip bump structure 1200 of FIG. 20 and/or interconnection balls are formed in a manner similar to that discussed above regarding FIG. 11, the discussion of which is herein incorporated by reference.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A flip chip bump structure comprising:
   a dielectric layer;
   a trace coupled to the dielectric layer;
   a patterned buildup layer on a first surface of the dielectric layer, the patterned buildup layer comprising a patterned buildup layer opening exposing the trace;
   a flip chip bump in the patterned buildup layer opening, the flip chip bump comprising a portion of a blanket conductive filler layer remaining in the patterned buildup layer opening, the flip chip bump further comprising an exterior surface that is coplanar with a first surface of the patterned buildup layer;
   a portion of a conductor layer remaining in the patterned buildup layer opening;
   a lower circuit pattern coupled to a second surface of the dielectric layer, the lower circuit pattern comprising a land; and
   an interconnection ball directly on the land.

2. The flip chip bump structure of claim 1 further comprising:
   an electronic component that comprises an active surface comprising a bond pad, the bond pad being physically and electrically coupled to the flip chip bump.

3. A flip chip bump structure comprising:
   a dielectric layer;
   a trace coupled to the dielectric layer;
   a patterned buildup layer on a first surface of the dielectric layer, the patterned buildup layer comprising a patterned buildup layer opening exposing the trace, the patterned buildup layer opening having a width less than a width of the trace; and
   a flip chip bump in the patterned buildup layer opening and coupled to the trace, the flip chip bump being entirely cylindrical and having a uniform diameter less than the width of the patterned buildup layer opening.

4. The flip chip bump structure of claim 3 further comprising a conductor layer portion, the flip chip bump being coupled to the trace by the conductor layer portion.

5. The flip chip bump structure of claim 3 further comprising an upper circuit pattern comprising the trace and a second trace, the patterned buildup layer covering and electrically isolating the second trace.

6. The flip chip bump structure of claim 3 wherein the trace is embedded in the dielectric layer.

7. The flip chip bump structure of claim 3 wherein the diameter of the flip chip bump is greater than the width of the trace.

8. The flip chip bump structure of claim 3 wherein the patterned buildup layer opening is a rectangular channel.

9. The flip chip bump structure of claim 3 wherein the patterned buildup layer opening is a cylindrical opening.

10. The flip chip bump structure of claim 3 wherein the flip chip bump is spaced apart from the patterned buildup layer.

11. The flip chip bump structure of claim 3 wherein a gap exists between the flip chip bump and the patterned buildup dielectric layer.

12. The flip chip bump structure of claim 3 wherein the flip chip bump comprises copper.

13. The flip chip bump structure of claim 3 wherein the flip chip bump further comprises an exterior surface that is coplanar with a first surface of the patterned buildup layer.

14. A flip chip bump structure comprising:
    a dielectric layer;
    a trace coupled to the dielectric layer;
    a patterned buildup layer on a first surface of the dielectric layer, the patterned buildup layer comprising a patterned buildup layer opening exposing the trace; and
    a flip chip bump in the patterned buildup layer opening and coupled to the trace, the flip chip bump being entirely cylindrical and having a uniform diameter less than a width of the patterned buildup layer opening, wherein the flip chip bump protrudes outwards and beyond the patterned buildup layer.

15. The flip chip bump structure of claim 14 wherein the width of the patterned buildup layer opening is larger than a width of the trace.

16. A flip chip bump structure comprising:
    a dielectric layer;
    a trace coupled to the dielectric layer;
    a patterned buildup layer on a first surface of the dielectric layer, the patterned buildup layer comprising a patterned buildup layer opening exposing the trace, the patterned buildup layer opening having a uniform width;
    a conductor layer on the patterned buildup layer and within the patterned buildup layer opening;
    a patterned upper resist on the conductor layer, the patterned upper resist comprising a flip chip bump opening directly above the trace exposed through the patterned buildup layer opening; and
    a conductive layer filling the flip chip bump opening.

17. The flip chip bump structure of claim 16 wherein the flip chip bump opening has a diameter less than the width of the patterned buildup layer opening.

18. The flip chip bump structure of claim 16 wherein the flip chip bump opening has a diameter greater than the width of the patterned buildup layer opening.

* * * * *